United States Patent
Ye

(10) Patent No.: US 7,361,994 B2
(45) Date of Patent: Apr. 22, 2008

(54) SYSTEM TO CONTROL SIGNAL LINE CAPACITANCE

(75) Inventor: Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 11/239,952

(22) Filed: Sep. 30, 2005

(65) Prior Publication Data

US 2007/0075405 A1    Apr. 5, 2007

(51) Int. Cl.
  H01L 23/52    (2006.01)
  H01L 23/48    (2006.01)
  H01L 29/40    (2006.01)

(52) U.S. Cl. ............... 257/758; 257/E23.174; 257/774; 257/775; 439/68; 439/55; 439/65

(58) Field of Classification Search ..............
  257/E23.173–E23.175, 666, 758, 774, 775; 439/68, 55, 65, 72, 85; 333/33
  See application file for complete search history.

(56) References Cited

U.S. PATENT DOCUMENTS

| | | | | |
|---|---|---|---|---|
| 4,494,083 A | * | 1/1985 | Josefsson et al. ............. | 333/33 |
| 5,057,798 A | * | 10/1991 | Moye et al. ................... | 333/33 |
| 6,023,211 A | * | 2/2000 | Somei ......................... | 333/246 |
| 6,400,234 B1 | * | 6/2002 | Ohhashi et al. ............... | 333/33 |
| 6,426,686 B1 | * | 7/2002 | Douriet et al. ............... | 333/247 |
| 6,590,545 B2 | * | 7/2003 | McCorkle .................... | 343/830 |
| 6,867,124 B1 | * | 3/2005 | Clemons et al. ............. | 438/616 |
| 6,914,573 B1 | * | 7/2005 | McCorkle .................... | 343/767 |
| 7,045,719 B1 | * | 5/2006 | Alexander et al. ........... | 174/262 |
| 7,132,985 B2 | * | 11/2006 | Lin ...................... | 343/700 MS |
| 7,154,356 B2 | * | 12/2006 | Brunette et al. .............. | 333/33 |

* cited by examiner

Primary Examiner—Chris C. Chu
(74) Attorney, Agent, or Firm—Buckley, Maschoff & Talwalkar LLC

(57) ABSTRACT

A system may include a conductive plane defining a non-conductive antipad area and a second non-conductive area extending from the antipad area in at least a first direction, a dielectric plane coupled to the conductive plane, a conductive via passing through the dielectric plane and the antipad area, a conductive pad connected to an end of the conductive via, and a conductive trace coupled to the dielectric plane and connected to the conductive pad, the conductive trace extending from the conductive pad in the first direction.

11 Claims, 13 Drawing Sheets

SYSTEM TO CONTROL SIGNAL LINE CAPACITANCE

BACKGROUND

A substrate typically provides physical support, signal routing and other functions to an electrical system mounted thereon. A substrate may comprise a motherboard carrying discrete electrical components, integrated circuits (ICs), and the like, or an IC package supporting an IC die. Conventional substrates often include several layers of conductive planes to carry electrical reference (e.g., Power and Ground) signals.

FIG. 1 is a cross-sectional side view of a prior art system. Substrate 1 includes conductive planes 21, 22 and 23 separated by dielectric layers 30, 31, 32 and 33. Conductive via 40 passes through each of dielectric planes 30, 31, 32 and 33 and through a non-conductive area (e.g., an antipad) of each of conductive planes 21, 22 and 23. Conductive trace 50 is connected to via 40 and is to carry electrical signals to and from conductive interface 60 of an electrical component (not shown). Conductive interface 60 may comprise a connector, a socket, a pin, a solder ball, etc.

Via 40 may provide mechanical support for mounting conductive interface 60 to substrate 1, as well as a means to connect conductive interface 60 to a conductive trace residing in another layer of substrate 1. However, a stub portion of via 40 may present an undesirable capacitive load into a signal path that includes trace 50, thereby deteriorating the performance thereof.

DETAILED DESCRIPTION

Figure 1:
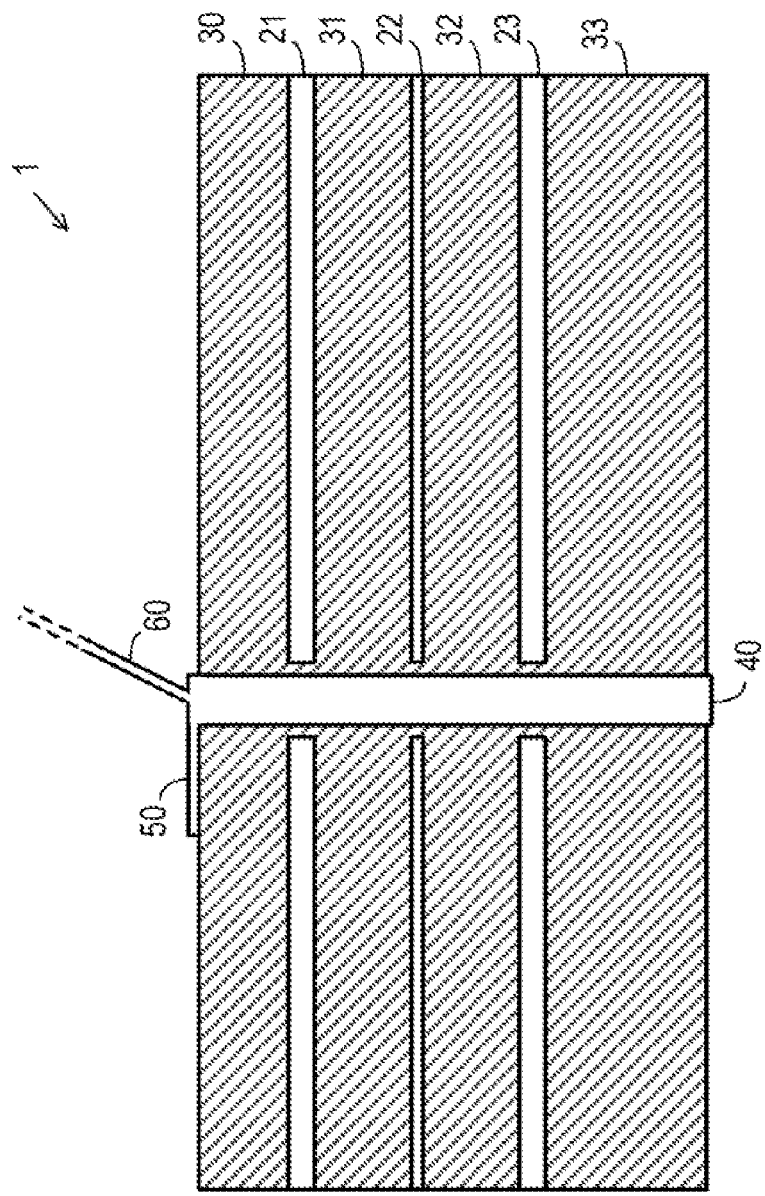
FIG. 1 is a cross-sectional side view of a prior art system.
Figure 2:
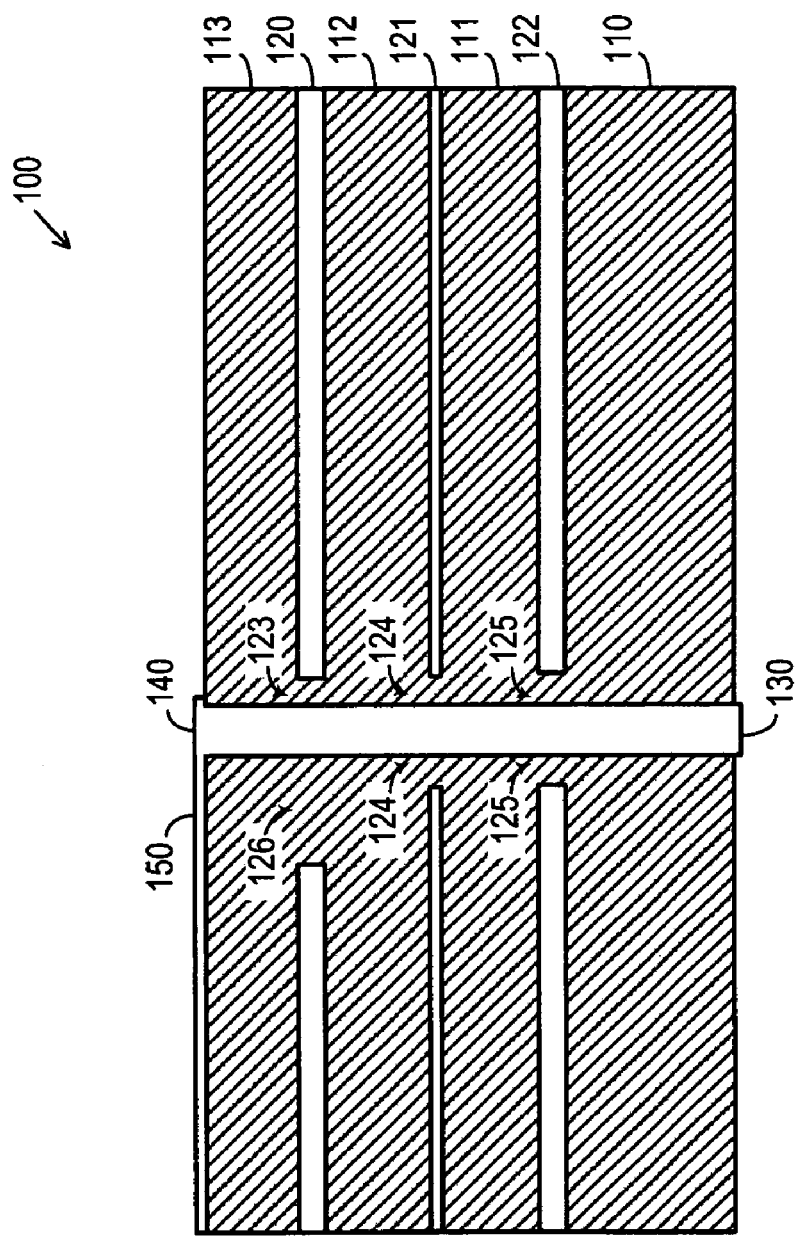
FIG. 2 is a cross-sectional side view of an apparatus according to some embodiments.

FIG. 2 is a cross-sectional side view of a portion of substrate 100 according to some embodiments. Substrate 100 may comprise a motherboard, an IC package or any other suitable substrate that is or becomes known. Substrate 100 may comprise a portion of a multi-layered substrate, and may comprise any ceramic, organic, and/or other suitable material.

Substrate 100 includes base dielectric layer 110. Layer 110 may be composed of any suitable material, including but not limited to bismalemide triazine (BT) and FR4 in some embodiments. Dielectric planes 111, 112 and 113 may be composed of dielectric material and/or other material such as BT or FR4.

Conductive planes 120, 121 and 122 separate layer 110 and dielectric planes 111, 112 and 113 from one another. Conductive planes 120 and 122 may comprise reference planes for supplying reference voltages to electrical components that are connected to substrate 100. Conductive plane 121 comprises a routing layer including conductive traces for carrying electrical signals. The aforementioned electrical components may be connected to one of planes 120, 121 or 122 by conductive vias that pass through one or more planes of substrate 100.

Conductive planes 120, 121 and 122 define respective non-conductive antipad" areas 123, 124 and 125 through which via 130 may pass so as not to electrically connect via 130 to any of conductive planes 120, 121 and 122. Rather, an end of conductive via 130 is connected to conductive pad 140, which is in turn connected to conductive trace 150. The portion of conductive via 130 that passes from layer 113 through layer 110 may be referred to as a "stub". Conductive pad 140 may be suited to receive an electrical connector of an electronic component.

Conductive plane 120 also defines non-conductive area 126 extending from antipad area 123 in a first direction. Conductive trace 150 extends from conductive pad 140 in the first direction as well. Such an arrangement may result in an inductive section of trace 150 that compensates for excess capacitance of via 130.

Figure 2A:
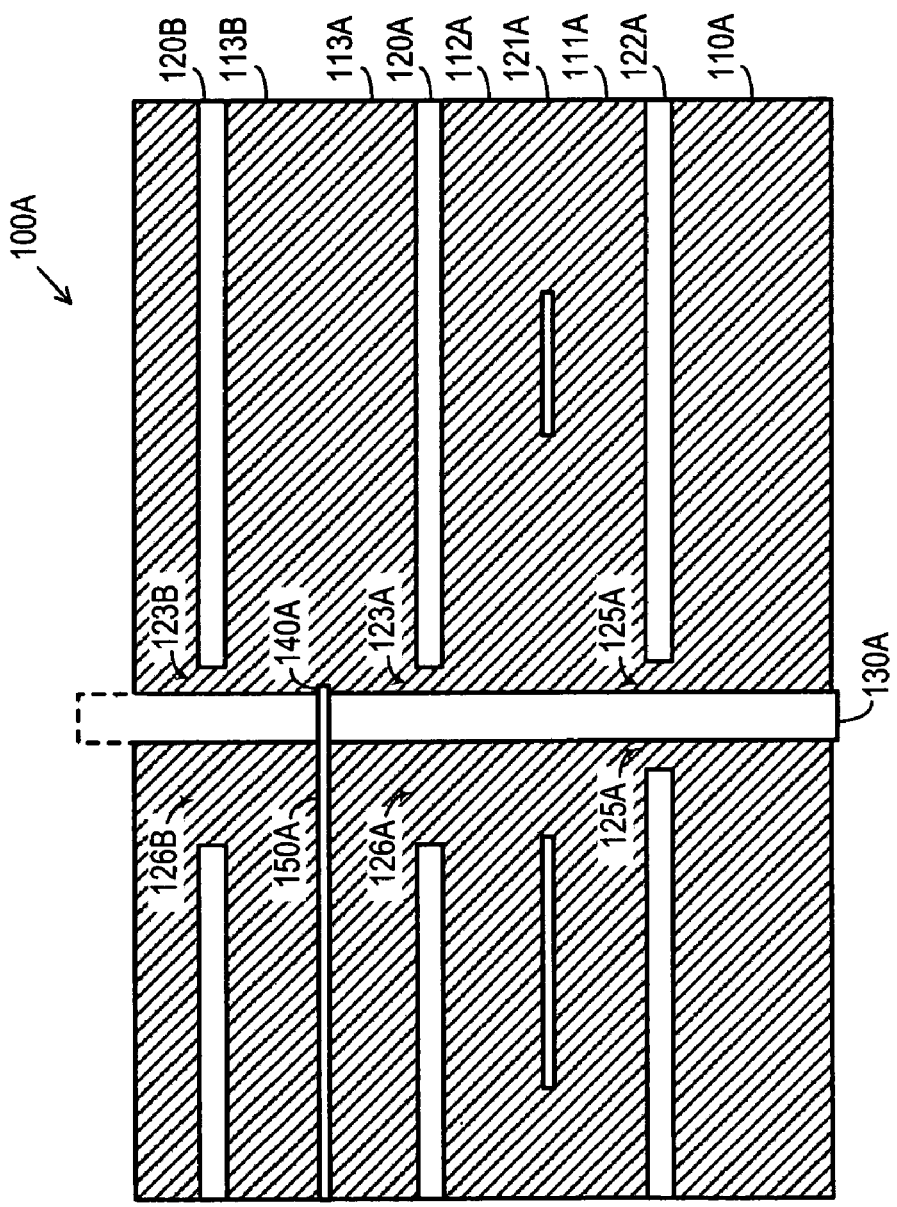
FIG. 2A is a cross-sectional side view of an apparatus according to some embodiments.

FIG. 2A illustrates an alternative implementation according to some embodiments. Apparatus 100A includes planes 100A, 111A, 112A, 113A, 120A and 122A that may be embodied similarly to planes 110, 111, 112, 113, 120 and 122 of apparatus 100. Apparatus 100A also includes plane 113B. Conductive routing plane 121A appears different from conductive plane 121 to illustrate a trace routing that differs from the trace routing of plane 121. Conductive plane 122A defines non-conductive antipad area 125A.

Trace 150A is connected to conductive pad 140A and extends in a first direction therefrom. Conductive planes 120A and 120B include respective non-conductive areas 126A and 126B that extend in the first direction from non-conductive antipad areas 123A and 123B. Such an arrangement may increase the inductance of trace 150A in comparison to an apparatus that lacks either or both of non-conductive areas 126A and 126B. The inductance may compensate for the capacitance of stub portions of via 130A.

Figure 3:
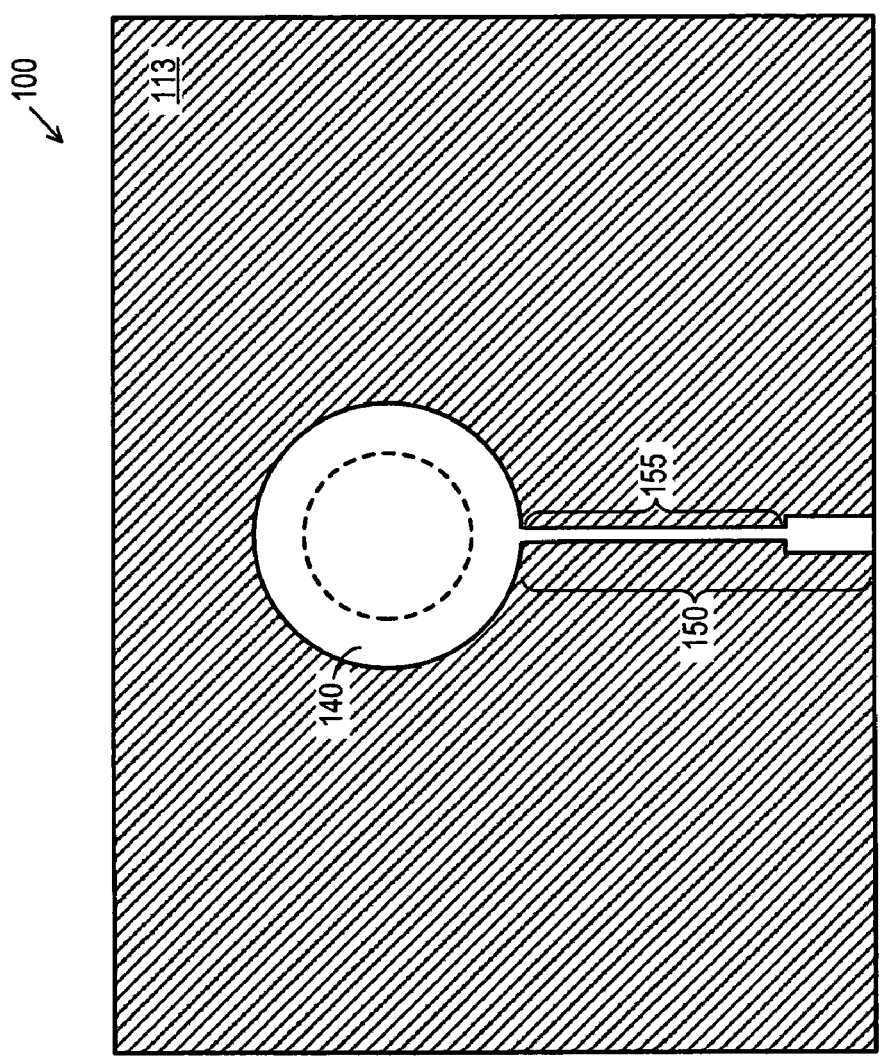
FIG. 3 is a top view of an apparatus according to some embodiments.

FIG. 3 is a top view of substrate 100 to further illustrate some embodiments. As shown, conductive pad 140 is connected to conductive trace 150, which is in turn connected to dielectric plane 113. The dotted line of FIG. 3 is intended to represent an end of via 130 located underneath pad 140 and connected thereto. Conductive trace 150 includes portion 155 extending from pad 140. According to the illustrated embodiment, portion 155 is narrower than at least one other portion of trace 150. In other embodiments, a width of trace 150 is substantially constant throughout the illustrated length.

Figure 4:
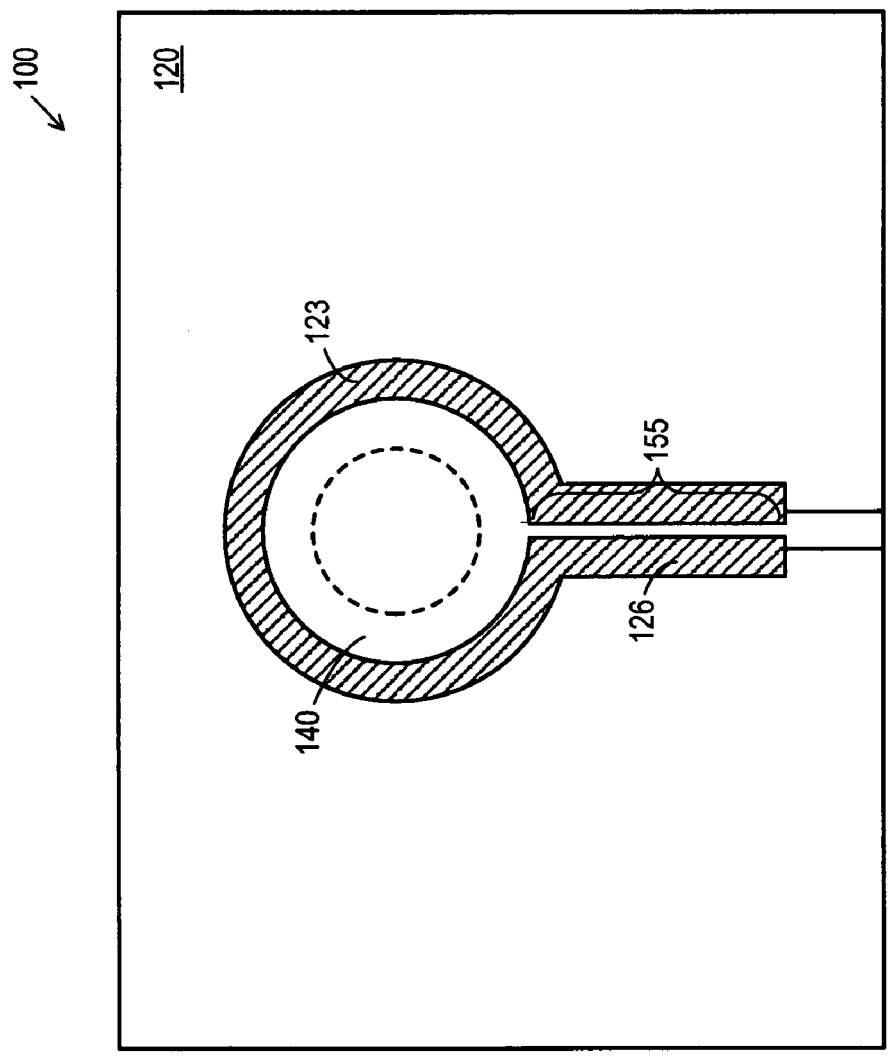
FIG. 4 is a cutaway top view of an apparatus according to some embodiments.

FIG. 4 is a cutaway top view of substrate 100 to illustrate a physical relationship between portion 155 and non-conductive area 126 according to some embodiments. Dielectric plane 113 has been removed, revealing conductive plane 120. FIG. 4 also shows non-conductive antipad area 123 and non-conductive area 126 of plane 120.

As shown, portion 155 of trace 150 extends from pad 140 in a first direction and non-conductive area 126 of plane 120 extends from antipad area 126 in the first direction. Moreover, portion 155 is disposed above non-conductive area 126. The illustrated embodiment further shows that portion 155 is narrower than other portions of trace 150 that are disposed above conductive areas of plane 120.

In some embodiments, via 130 may be connected to a conductive reference plane and/or a conductive trace internal to substrate 100. Accordingly, substrate 100 may include one or more layers of conductive traces for carrying electrical signals. In this regard, any conductive element described herein may comprise copper or any other suitable conductive material.

Figure 5:
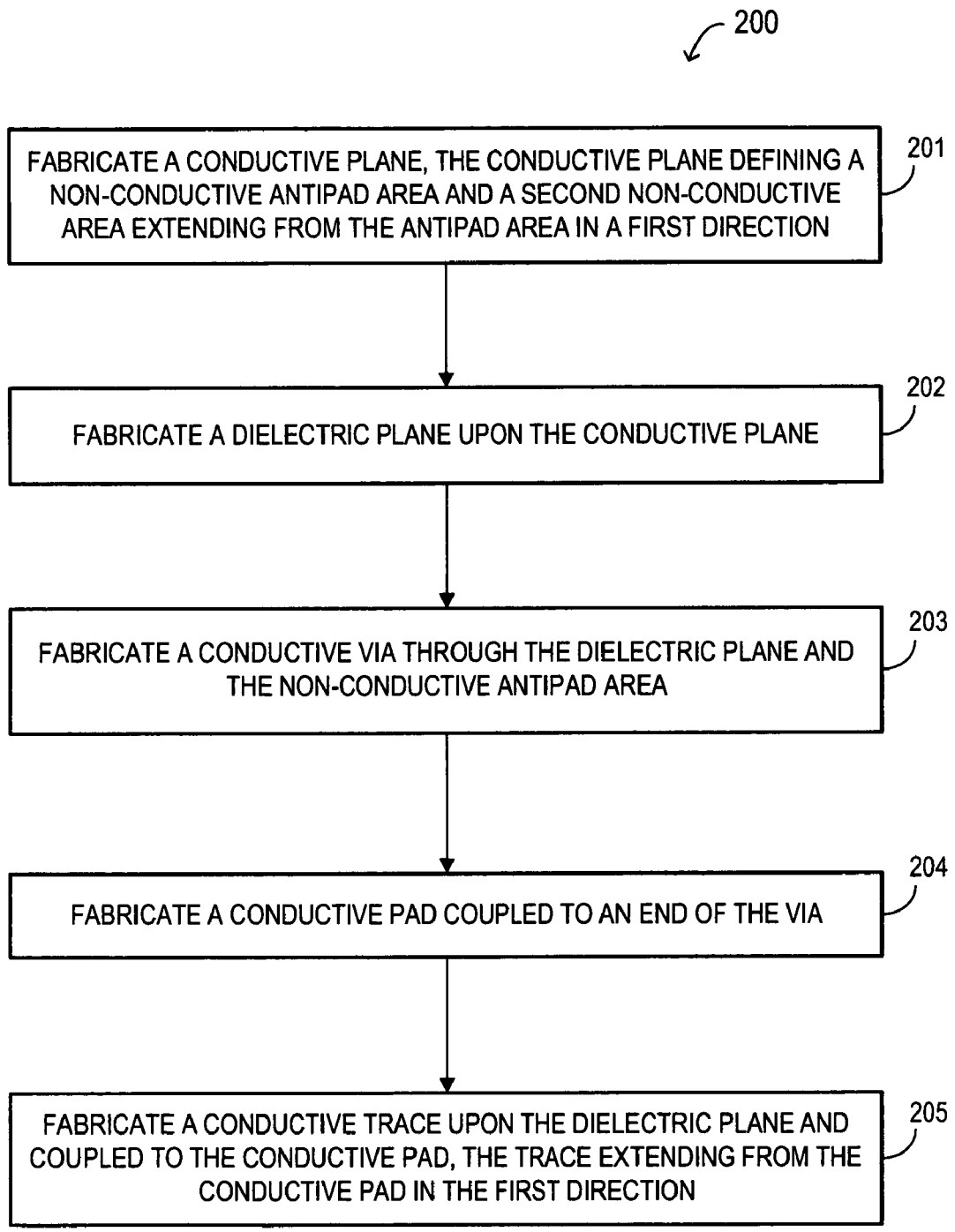
FIG. 5 is a diagram of a process to fabricate an apparatus according to some embodiments.

FIG. 5 is a diagram of process 200 to fabricate an apparatus according to some embodiments. Process 200 may be executed by one or more fabrication devices, and all or a part of process 200 may be executed manually. Process 200 may be executed by an entity that is different from an entity that connects an electrical component to an apparatus resulting from process 200.

Initially, at 201, a conductive plane is fabricated. The fabricated conductive plane defines a non-conductive antipad area and a second non-conductive area extending from the antipad area in a first direction. The conductive plane may be fabricated on any suitable base using any suitable system.

Figure 6:
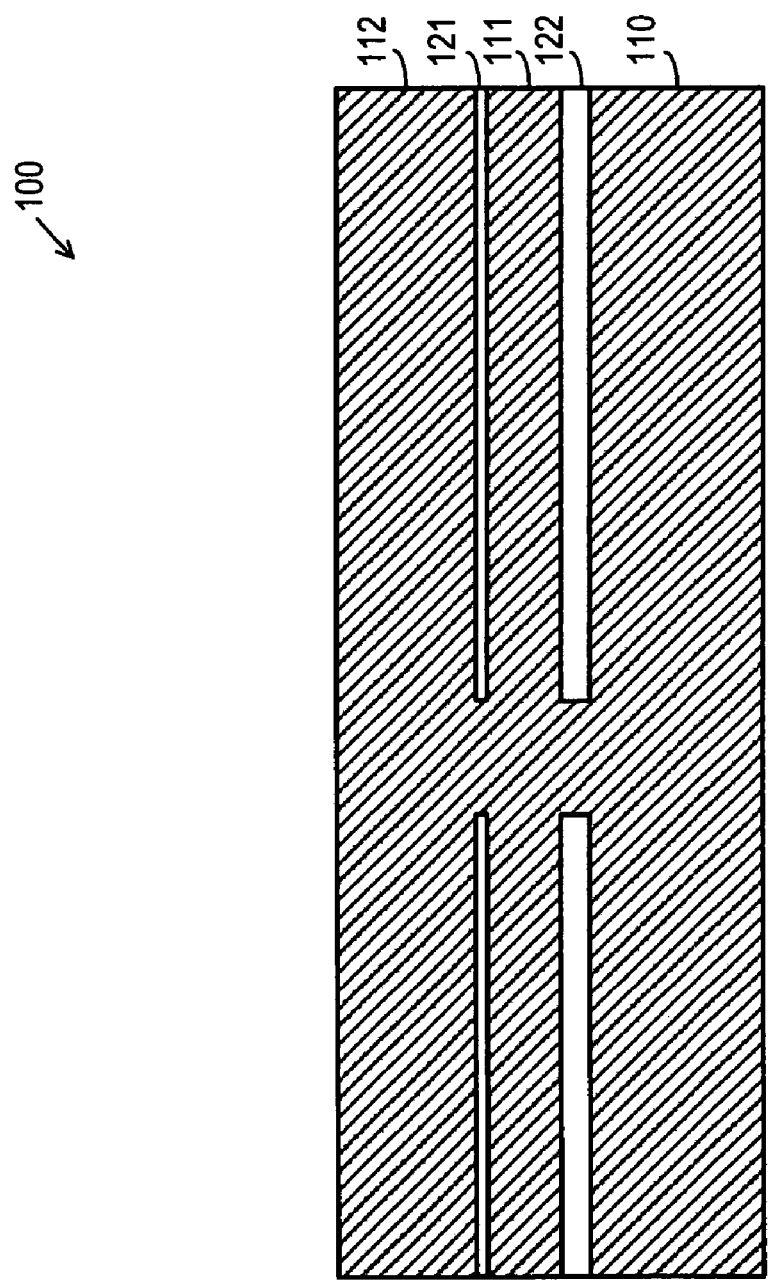
FIG. 6 illustrates fabrication of an apparatus according to some embodiments.
Figure 7:
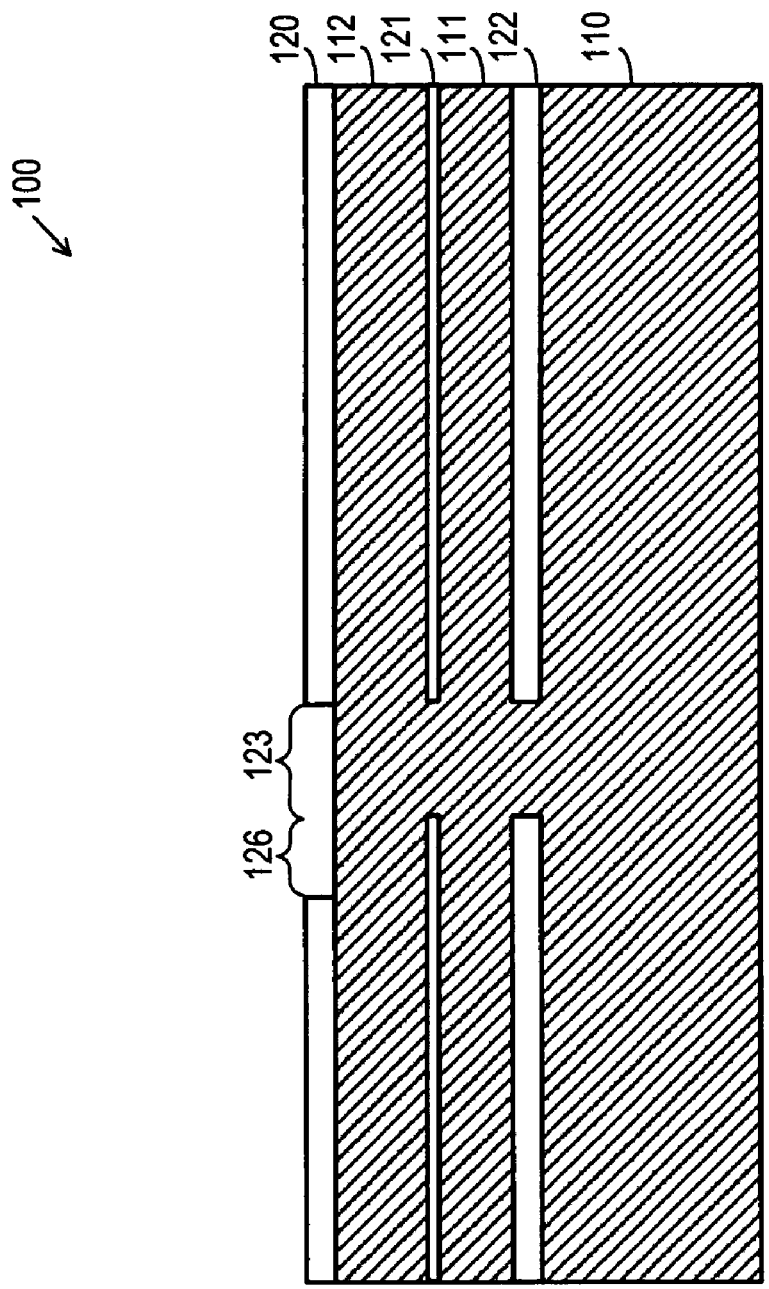
FIG. 7 illustrates fabrication of an apparatus according to some embodiments.

FIG. 6 illustrates a partial construction of above-mentioned substrate 100 in order to provide an example of 201 according to some embodiments. Accordingly, the conductive layer may be fabricated at 201 upon dielectric layer 112 of substrate 100. A resulting structure is illustrated in FIG. 7, with conductive layer 120 defining non-conductive antipad area 123 and second non-conductive area 126.

Conductive layer 120 may be fabricated on plane 112 using currently- or hereafter- known techniques including but not limited to sputtering, electroplating, and chemical vapor deposition. Photolithography techniques may be used to define area 123 and 126. In some examples thereof, photoresist is selectively applied to areas 123 and 126 on dielectric plane 112 using any suitable process such as masking, exposure, and stripping. A conductor is then deposited on the resulting structure, and the photoresist is removed. The photoresist may comprise dry film, liquid, or other photoresist and may be deposited using any currently- or hereafter-known techniques.

A dielectric plane is fabricated upon the conductive plane at 202. The dielectric plane may be laminated, spray coated, or fabricated using other techniques. The dielectric plane may comprise any suitable dielectric material, including a polymer material. Again, any currently- or hereafter-known system to fabricate a dielectric plane may be employed at 202.

Figure 8:
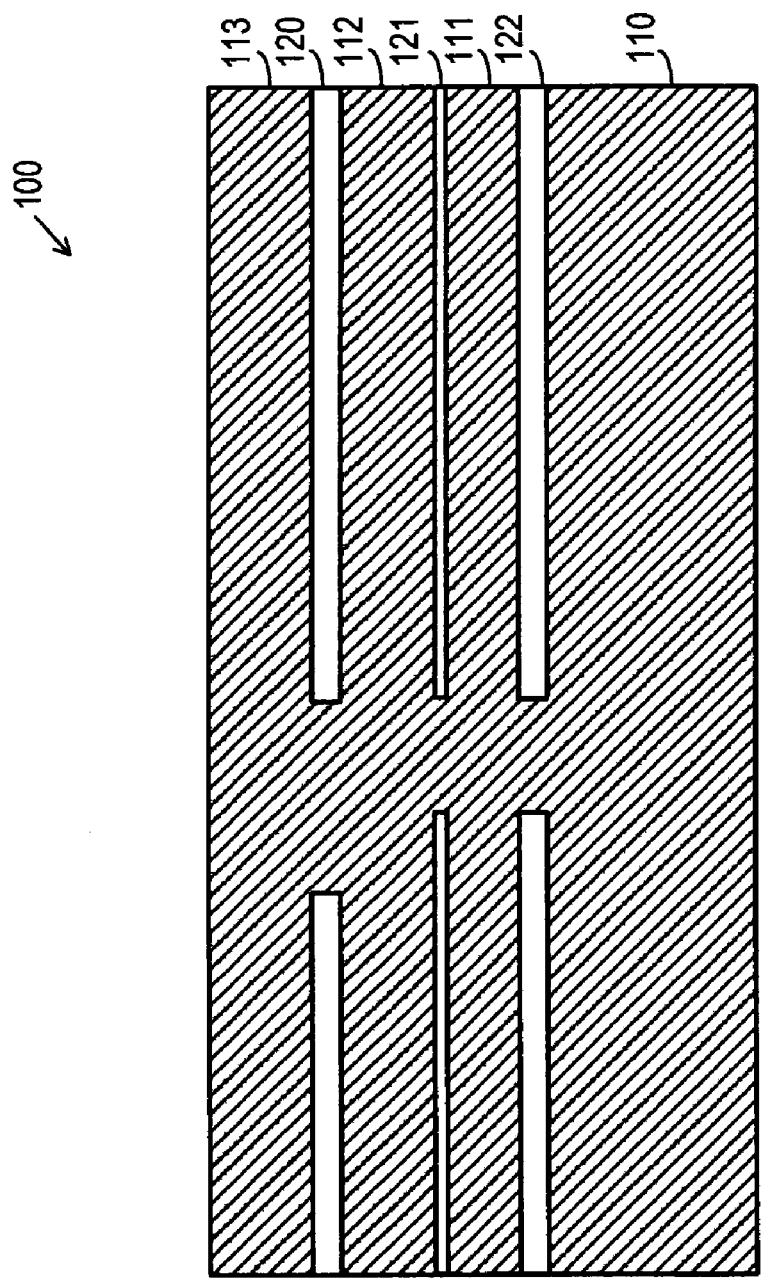
FIG. 8 illustrates fabrication of an apparatus according to some embodiments.

FIG. 8 illustrates structure 100 of the present example according to some embodiments of 202. Dielectric layer 113 has been formed, and dielectric material also fills areas 123 and 126 defined by conductive plane 120. Some embodiments may fill areas 123 and 126 with non-conductive material at 201. Such non-conductive material may be different from or identical to the dielectric material of plane 113.

Figure 9:
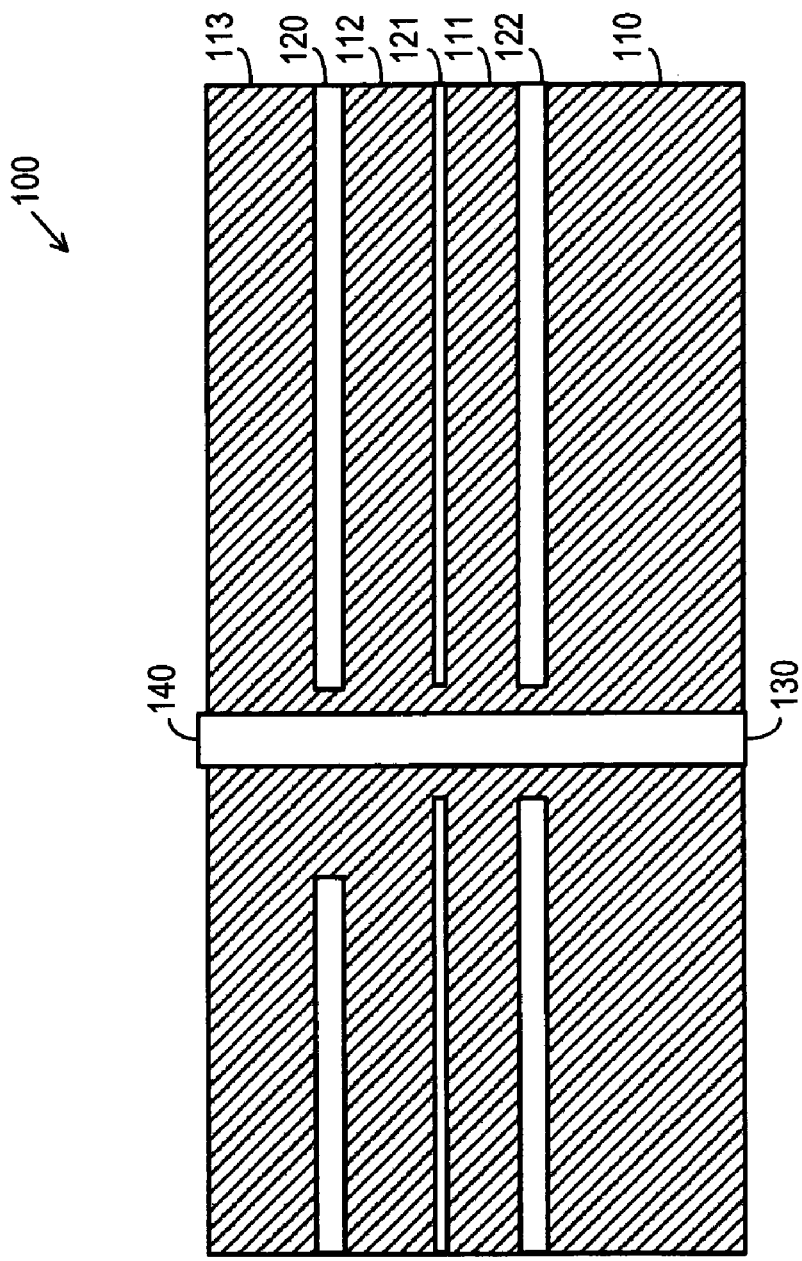
FIG. 9 illustrates fabrication of an apparatus according to some embodiments.
Figure 10:
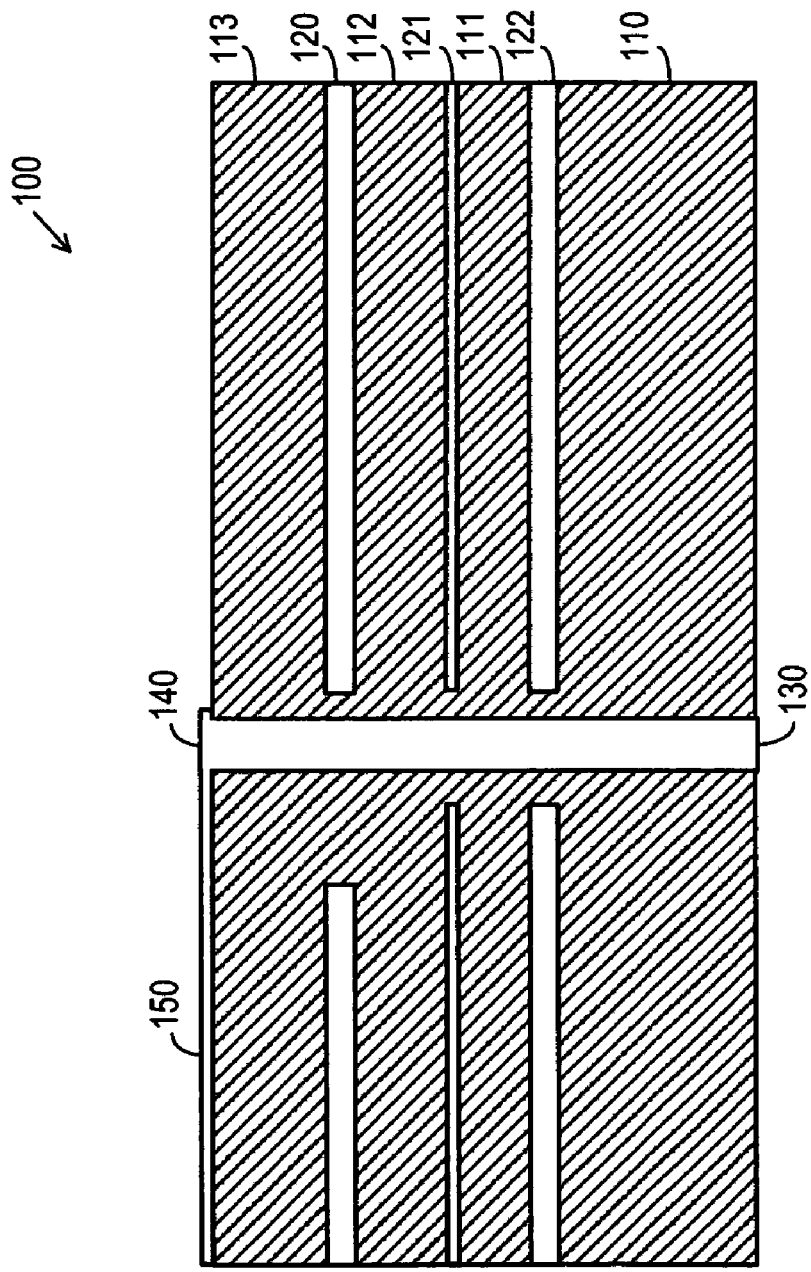
FIG. 10 illustrates fabrication of an apparatus according to some embodiments.

Next, at 203, a conductive via is fabricated through the dielectric plane of 202 and the non-conductive antipad area of 201. In some examples, the conductive via is fabricated using conventional photolithography and/or by drilling a hole and plating an interior surface of the hole with conductive material. FIG. 9 is a cutaway view of substrate 100 after some embodiments of 203. Conductive via 130 is shown passing through dielectric plane 113 and antipad area 123 as well as through dielectric planes 112, 111 and antipad areas 124, 125.

FIG. 9 also illustrates fabrication of a conductive pad at 204. In the illustrated example, conductive pad 140 is connected to an end of conductive via 130 and may be suited to receive a connector of an electrical component. In some embodiments, a conductive pad is fabricated at 204 substantially simultaneously with the fabrication of a conductive trace at 205.

Such a conductive trace is fabricated at 205 upon the dielectric plane fabricated at 202 and is connected to the conductive pad fabricated at 204. Moreover, the conductive trace extends from the conductive pad in the first direction described above with respect to 201. FIG. 4 illustrates conductive trace 150 that may be fabricated at 205 according to some embodiments. As shown in FIG. 4, trace 150 extends from conductive pad 140 in a same direction as non-conductive area 126 extends from antipad area 123.

According to some embodiments of process 200, the conductive trace fabricated at 205 includes a first portion disposed above a portion of the second non-conductive area of the conductive plane. Additionally, as illustrated in FIG. 4, the fabricated conductive trace may include a second portion disposed above a conductive portion of the conductive plane, with the first portion of the conductive trace being narrower than the second portion. Moreover, an inductance of the first portion may compensate for a capacitance of the conductive via.

Figure 11:
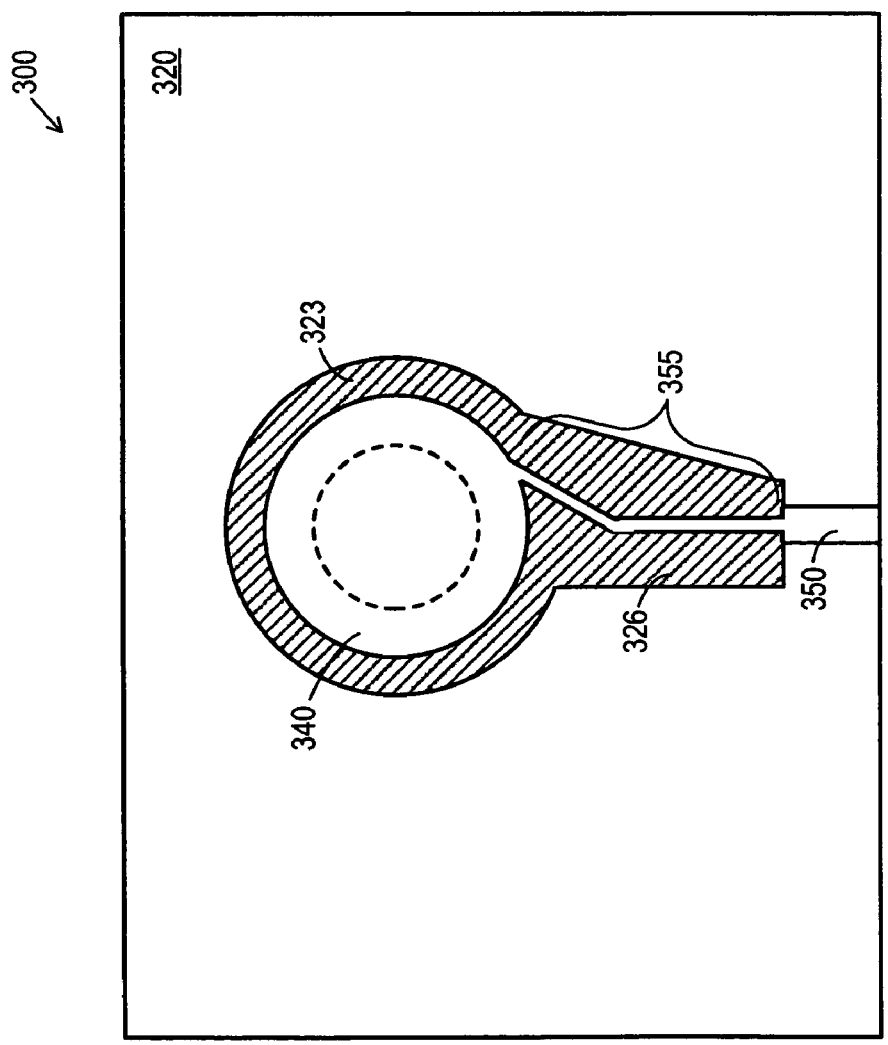
FIG. 11 is a cutaway top view of an apparatus according to some embodiments.

FIG. 11 illustrates a cutaway top view of an apparatus according to some embodiments. Apparatus 300 may be fabricated according to process 200 or by a different process. FIG. 11 is similar to FIG. 4 in that a dielectric plane between conductive pad 340 and conductive plane 320 has been removed to illustrate a relationship between conductive trace 350 and non-conductive area 326.

In particular, portion 355 of trace 350 extends from pad 340 in a first direction and non-conductive area 326 of conductive plane 320 also extends from antipad area 323 in the first direction. Portion 355 is disposed above non-conductive area 326, and is narrower than other portions of trace 350 that are disposed above conductive areas of plane 320. In some implementations, portion 355 may exhibit a greater inductance than portion 155 of FIG. 4.

Figure 12:
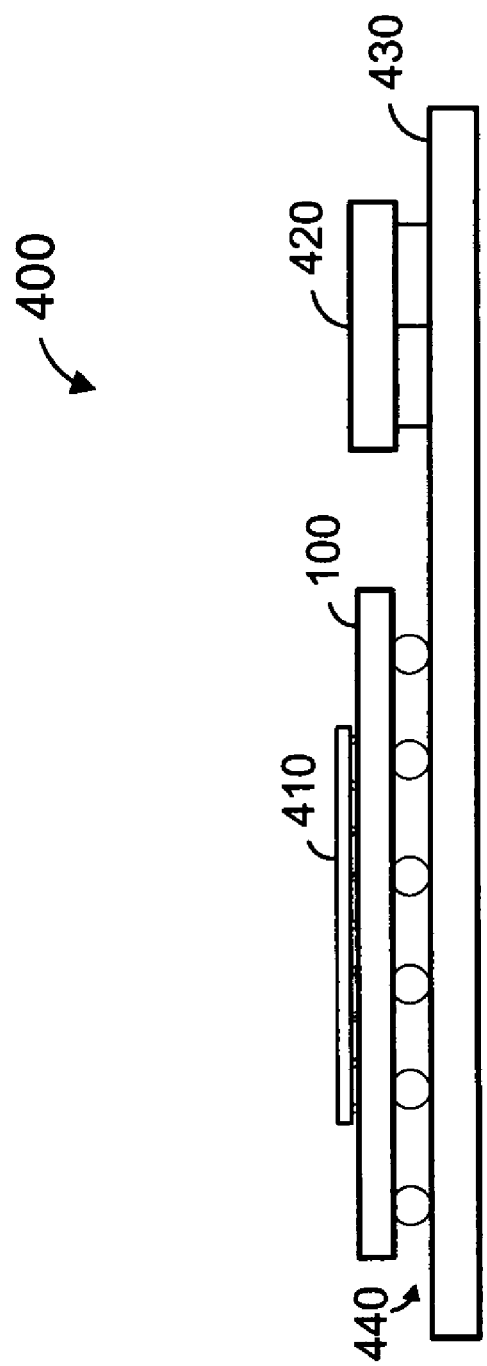
FIG. 12 is a side elevational view of a system according to some embodiments.

FIG. 12 is a side elevation of system 400 according to some embodiments. System 400 may comprise components of a personal computer platform. System 400 includes substrate 100 as described above, IC die 410, memory 420 and motherboard 430. IC die 410 comprises a microprocessor and substrate 100 comprises an IC package including features of the embodiments described herein. Motherboard 430 may also comprise features of the embodiments described herein.

Motherboard 430 may electrically connect memory 420 to substrate 100. More particularly, motherboard 430 may comprise a memory bus (not shown) that is electrically connected to electrical contacts 440 and to memory 420. Memory 420 may comprise any type of memory for storing data, such as a Single Data Rate Random Access Memory, a Double Data Rate Random Access Memory, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
   a conductive reference plane defining a non-conductive antipad area and a non-conductive area extending from the non-conductive antipad area in at least a first direction;
   a dielectric plane coupled to the conductive reference plane;
   a conductive via passing through the dielectric plane and the antipad area;
   a conductive pad connected to an end of the conductive via, the dielectric plane disposed between the conductive pad and the conductive plane; and
   a conductive trace coupled to the dielectric plane and connected to the conductive pad,
   wherein the conductive trace extends from the conductive pad in the first direction,
   wherein a first portion of the conductive trace is disposed above a portion of the non-conductive area,
   wherein the conductive trace comprises a second portion disposed above a conductive portion of the conductive reference plane, and
   wherein the first portion of the conductive trace is narrower than the second portion of the conductive trace.

2. An apparatus according to claim 1, wherein the conductive reference plane comprise a first portion and a second portion and the antipad area is between the first portion and the second portion,
   wherein the first portion of the conductive reference plane is a first distance from the conductive via,
   wherein the second portion of the conductive plane is a second distance from the conductive via,
   wherein the first distance is less than the second distance, and
   wherein the second portion of the conductive reference plane is disposed below the conductive trace.

3. An apparatus according to claim 2, wherein the conductive trace further comprises:
   a third portion,
   wherein the first portion is coupled to the conductive pad,
   wherein the third portion is coupled between the first portion and the second portion,
   wherein the first portion and the third portion are narrower than the second portion,
   wherein the first portion and the third portion form an obtuse angle, and
   wherein the first portion and the conductive pad form an acute angle.

4. An apparatus according to claim 2,
   wherein an inductance of the portion of the conductive trace compensates for a capacitance of the conductive via.

5. An apparatus according to claim 1, further comprising:
   a second conductive reference plane coupled to the dielectric plane and defining a second non-conductive antipad area, the dielectric plane disposed between the conductive plane and the second conductive plane; and
   a second dielectric plane coupled to the second conductive plane,
   wherein the conductive via passes through the second dielectric plane and the second antipad area.

6. An apparatus according to claim 1,
   wherein the conductive pad is to receive a conductive interface.

7. A system comprising:
   a substrate comprising:
      a conductive reference plane defining a non-conductive antipad area and a non-conductive area extending from the non-conductive antipad area in at least a first direction;
      a dielectric plane coupled to the conductive reference plane;
      a conductive via passing through the dielectric plane and the antipad area;
      a conductive pad connected to an end of the conductive via, the dielectric plane disposed between the conductive pad and the conductive plane; and
      a conductive trace coupled to the dielectric plane and connected to the conductive pad, the conductive trace extending from the conductive pad in the first direction;
   a microprocessor connected to the conductive pad; and
   a double data rate memory connected to the substrate,
   wherein a first portion of the conductive trace is disposed above a portion of the non-conductive area,
   wherein the conductive trace comprises a second portion disposed above a conductive portion of the conductive reference plane, and
   wherein the first portion of the conductive trace is narrower than the second portion of the conductive trace.

8. A system according to claim 7,
   wherein the conductive reference plane comprise a first portion and a second portion and the antipad area is between the first portion and the second portion,
   wherein the first portion of the conductive reference plane is a first distance from the conductive via,
   wherein the second portion of the conductive plane is a second distance from the conductive via,
   wherein the first distance is less than the second distance, and
   wherein the second portion of the conductive reference plane is disposed below the conductive trace.

9. A system according to claim 8, wherein the conductive trace further comprises:
   a third portion,
   wherein the first portion is coupled to the conductive pad,
   wherein the third portion is coupled between the first portion and the second portion,
   wherein the first portion and the third portion are narrower than the second portion,
   wherein the first portion and the third portion form an obtuse angle, and
   wherein the first portion and the conductive pad form an acute angle.

10. A system according to claim 8,
    wherein an inductance of the portion of the conductive trace compensates for a capacitance of the conductive via.

11. A system according to claim 7, further comprising:
    a second conductive reference plane coupled to the dielectric plane and defining a second non-conductive antipad area, the dielectric plane disposed between the conductive plane and the second conductive plane; and
    a second dielectric plane coupled to the second conductive plane, wherein the conductive via passes through the second dielectric plane and the second antipad area.

* * * * *